United States Patent [19]

Ieda et al.

[11] 4,070,590

[45] Jan. 24, 1978

[54] SENSING CIRCUIT FOR MEMORY CELLS

[75] Inventors: Nobuaki Ieda, Kodaira; Takao Yano, Tokorozawa, both of Japan

[73] Assignee: Nippon Telegraph and Telephone Public Corporation, Tokyo, Japan

[21] Appl. No.: 712,708

[22] Filed: Aug. 9, 1976

[30] Foreign Application Priority Data

Aug. 11, 1975 Japan .................................. 50-97848
Sept. 16, 1975 Japan .................................. 50-111929

[51] Int. Cl.² ........................ H03K 5/20; H03K 5/18; H03K 3/286; G11C 11/40
[52] U.S. Cl. ............................. 307/355; 307/238; 307/279; 307/DIG. 3; 365/203; 365/205
[58] Field of Search .......... 307/235 F, 235 T, 235 W, 307/238, 279, DIG. 3; 340/173 R, 173 CA

[56] References Cited

U.S. PATENT DOCUMENTS

| 3,774,176 | 11/1973 | Stein et al. | 307/DIG. 3 X |
|---|---|---|---|
| 3,838,295 | 9/1974 | Lindell | 307/DIG. 3 X |
| 3,892,984 | 7/1975 | Stein | 307/DIG. 3 X |
| 3,940,747 | 2/1976 | Kud et al. | 307/DIG. 3 X |
| 3,959,781 | 5/1976 | Mehta et al. | 307/DIG. 3 X |
| 3,973,139 | 8/1976 | Dingwall | 307/269 X |
| 3,993,917 | 11/1976 | Kalter | 307/238 X |

OTHER PUBLICATIONS

Furman et al., "Sense Latch Circuit for Memory Cells"; *IBM Tech. Discl. Bull.;* vol. 16, No. 9, pp. 2792–2793, 2/1974.

*Primary Examiner*—Larry N. Anagnos

[57] ABSTRACT

A weak signal detecting circuit in which a sensing circuit formed with a flip-flop circuit, and bit lines each having connected thereto a plurality of 1-transistor type memory cells, are interconnected by separation transistors for separating them from each other, and in which power supply transistors are inserted between power sources and the bit lines. When the power supply transistors are turned on, the separation transistors are turned off, so that a signal detection can be performed with little power consumption. Further, in such a case, the bit lines are disconnected from the sensing circuit to thereby enable a high-speed and highly sensitive detecting operation to be stably achieved regardless of the number of memory cells.

6 Claims, 7 Drawing Figures

SENSING CIRCUIT FOR MEMORY CELLS

BACKGROUND OF THE INVENTION

1. Field of the Invention

This invention relates to a weak signal detecting circuit, and more particularly to a weak signal detecting circuit which consumes a very small amount of power in the detection of a weak signal from a memory cell of a semiconductor memory and, moreover, operates with high sensitivity, at high speed and with stability.

2. Description of the Prior Art

Generally, a typical circuit of a one-transistor type IC memory employing MIS transistors, that is, a memory having memory cells each composed of a MIS transistor and a capacitance, is such as shown in FIG. 1.

FIG. 1 shows one part of a circuit of a semiconductor memory manufactured and sold by Intel Corporation of the United States under the model No. i-2107B, illustrating the connections between a flip-flop type sensing circuit composed of MIS transistors $Q_1$ and $Q_2$ and memory cells of 2m bits. Reference characters $W_1, W_2, \ldots$ and $W_{2m}$ indicate word lines. Each memory cell M comprises a MIS transistor connected to each word line and a capacitance $C_S$ connected to the MIS transistor. A read operation in the above circuit may be summarized as follows: At first, bit lines $B_1$ and $B_2$ are precharged to a high level and a signal is applied to a predetermined word line to transfer information from the memory cell associated therewith to the bit line having connected thereto the memory cell. Within, a clock signal $\phi_D$ is applied to the gate of a transistor $Q_3$ to actuate the flip-flop type sensing circuit to amplify a weak signal from the memory cell, thus completing the read operation. To ensure a stable operation, a dummy memory cell is usually connected as an additional circuit to each bit line to provide a reference level for the memory cell information stored in the memory cells.

In the conventional circuit shown in FIG. 1, the bit lines $B_1$ and $B_2$ are charged up by separate precharge circuits to an initial value which is a level intermediate between the power source voltage $V_{DD}$ and the ground and a signal from a selected one of the memory cells is applied to the bit line associated therewith. Thereafter, a clock signal $\phi_D$ is applied to transistors $Q_6$ and $Q_7$ to turn them on, amplifying the signal from the memory cell. Since the bit lines $B_1$ and $B_2$ generally have large parasitic capacitances $C_{B1}$ and $C_{B2}$, the transistors $Q_6$ and $Q_7$ are required to have a large gm for rapidly amplifying the signal applied from the selected memory cell to the bit line. Further, when the transistors $Q_6$ and $Q_7$ are turned on, a current path is formed between the power source and the ground through either one of the transistors $Q_6$ and $Q_7$, either one of the transistors $Q_1$ and $Q_2$ and the transistor $Q_3$ to flow an extremely large current improper for an IC memory. This inevitably results in large power consumption and large heat generation, too.

Further, as a result of the present inventors' studies of the conventional circuit of FIG. 1, it has been found that when the load transistors $Q_6$ and $Q_7$ are assumed to be left out, the detection sensitivity is dependent upon the gain constants of the transistors $Q_1$ and $Q_2$ and the load capacitance of the sensing circuit, and that the following relationship equation holds:

$$\text{sensitivity} \propto \sqrt{\frac{C_0}{\beta_0}} \left| \frac{\Delta\beta_1 - \Delta\beta_2}{\beta_0} - \frac{\Delta C_{B1} - \Delta C_{B2}}{C_0} \right| \quad (1)$$

where $C_0$ is a designed central value of the parasitic capacitances $C_{B1}$ and $C_{B2}$; $\beta_0$ is a designed central value of the gain constant $\beta$ (that is, $\beta_1$ and $\beta_2$) of the transistors $Q_1$ and $Q_2$; $\Delta C_{B1}$ and $\Delta C_{B2}$ are amounts of deviation from $C_0$; and $\Delta\beta_1$ and $\Delta\beta_2$ are amounts of deviation from $\beta_0$. In the equation (1), the sensitivity is defined as the "detectable minimum signal level." Accordingly, if this value is small, it represents a high sensitivity. In the conventional circuit depicted in FIG. 1, since the load capacitance during the detecting operation includes all the capacitances in the bit lines, $C_0$ in the equation (1) becomes large and high sensitivity is difficult to obtain.

The above discussion has been made on the assumption that the load transistors $Q_6$ and $Q_7$ do not exist. However, where the transistors $Q_6$ and $Q_7$ are turned on and added to the components of the circuit during the detecting operation, the lower the impedances of these transistors, the more the sensitivity expressed by the equation (1) decreases. In other words, it further reduces the high sensitivity, as mentioned above.

In U.S. Pat. No. 3,879,621, there is disclosed the technique for separating the bit lines and the sensing circuit from each other, as required, by MIS transistors inserted therebetween. However, the invention of this United States patent is remarkedly different from the circuit of the present invention in that transistors for the power supply are disposed on the inside of the above-said separation transistors. Also the circuit of the referenced United States patent is of the type requiring no rewrite in the selected memory cell by the sensing circuit, and in that load transistors (identified by $QP_1$ and $QP_2$ in the specification of the above patent) of low impedance are turned on to greatly lower the detection sensitivity at the beginning of operation. These differences will become more apparent from the following detailed description of this invention.

SUMMARY OF THE INVENTION

An object of this invention is to provide a weak signal detecting circuit which is remarkably small in power consumption and suitable for use in a semiconductor memory of large capacity.

Another object of this invention is to provide a weak signal detecting circuit which is capable of detecting a weak signal with high sensitivity.

Still another object of this invention is to provide a weak signal detecting circuit which is capable of detecting a weak signal at high speed and which is stable in operation.

According to this invention, there is provided a weak signal detecting circuit in which MIS transistors are inserted between bit lines and a flip-flop type sensing circuit to cut off the capacitance in the bit lines from the sensing circuit during the operation thereof, and transistors for the main power supply are connected on the side of the bit lines with respect to the abovesaid MIS separation transistors, to thereby prevent the formation of a DC path between the power source and the ground and, at the same time, to prevent the connection of the low impedance load transistors to the sensing circuit.

DESCRIPTION OF THE PREFERRED EMBODIMENTS

Figure 1:
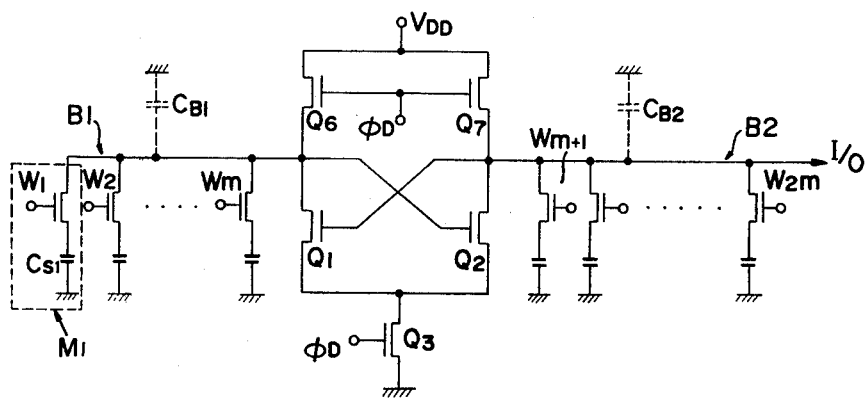
FIG. 1 is a circuit diagram showing the principal part of a conventional weak signal detecting circuit.
Figure 2:
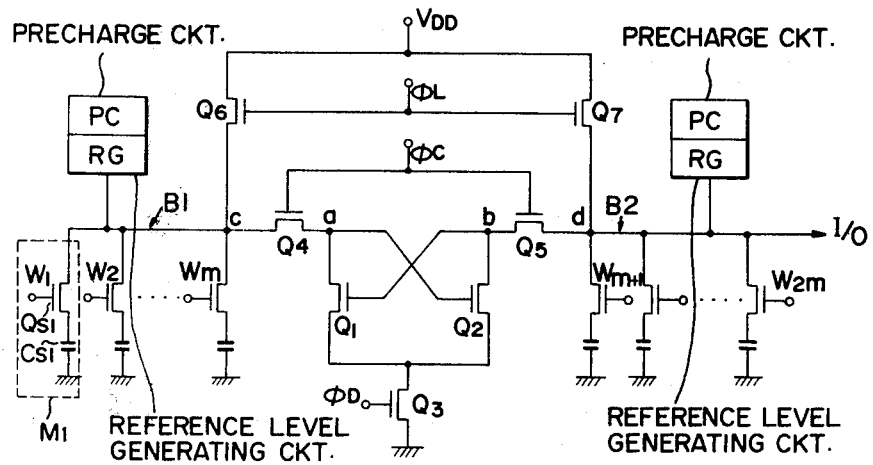
FIG. 2 is a circuit diagram illustrating the principal part of one embodiment of this invention.

FIG. 2 is a circuit diagram showing the principal parts of this invention. In FIG. 2, parts corresponding to those in FIG. 1 are marked with the same reference characters. This also applies to the other embodiments of this invention described later on.

In FIG. 2, a signal sensing circuit comprising transistors $Q_1$, $Q_2$ and $Q_3$ is similar to the sensing circuit shown in FIG. 1. However, transistors $Q_4$ and $Q_5$ are connected in series between the sensing circuit and bit lines $B_1$ and $B_2$ to permit disconnection of them from each other, as required. A clock signal $\phi_C$ is applied to the gates of the transistors $Q_4$ and $Q_5$, in common. Further, power supply transistors $Q_6$ and $Q_7$ are connected in series between the power source and the bit lines $B_1$ and $B_2$, respectively. When supplied at their gates with a clock signal $\phi_L$, the transistors $Q_6$ and $Q_7$ are turned on to supply the bit lines $B_1$ and $B_2$ with voltage such that the threshold voltage of the transistors $Q_6$ and $Q_7$ are subtracted from the power source voltage $V_{DD}$. Each of the bit lines $B_1$ and $B_2$ has connected thereto a required number of 1-transistor type memory cells, a precharge circuit PC and a reference level generating circuit RG. Each memory cell comprises a transistor and a capacitor. Reference characters $a$, $b$, $c$ and $d$ designate nodes and I/O identifies an input/output circuit.

Figure 3:
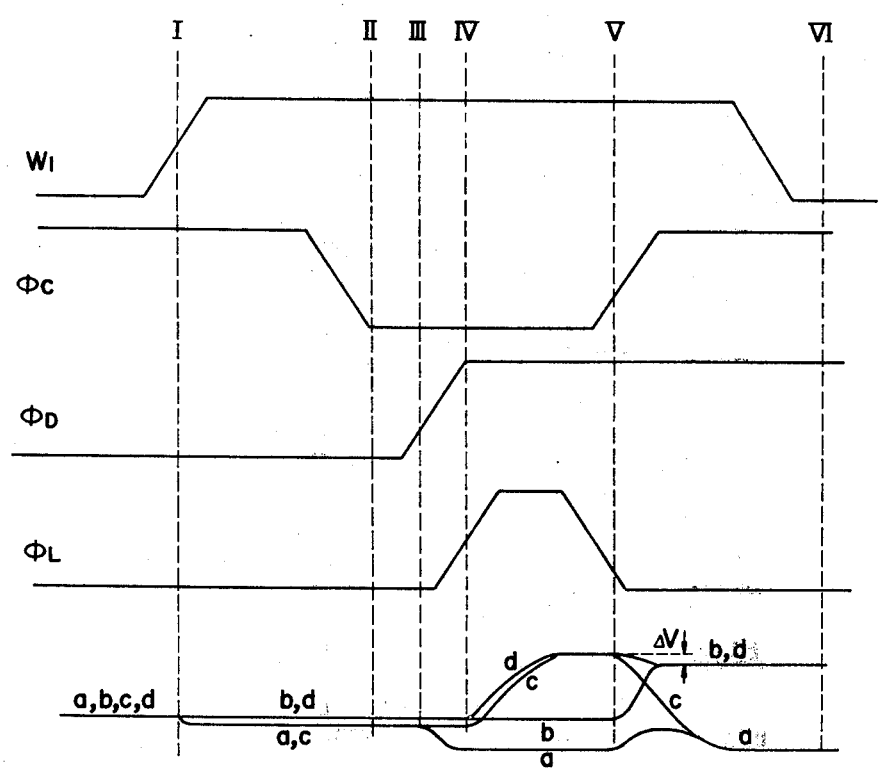
FIG. 3 is a timing chart explanatory of the operation of the circuit depicted in FIG. 2.

Turning now to FIG. 3, the operation of the circuit shown in FIG. 2 will be described in detail.

Let it be assumed that the power source voltage $V_{DD}$ is 12 volts, that a precharge level is 4 volts and that the precharge level and a reference level are equal to each other. Further, assume that before the memory cells are selected, that is, in the state prior to an instant I in FIG. 3, the clock signal $\phi_C$ is 12 volts, that the clock signals $\phi_L$ and $\phi_D$ are 0 volts and that potentials in the bit lines $B_1$ and $B_2$ and at the nodes $a$ and $b$ in the sensing circuit are set by the precharge circuits PC at 4 volts.

Now, assume that at the instant I, the memory cell $M_1$ having stored therein information "0" (0 volt) has been selected by the application of 12 volts to the word line $W_1$ to send out the information of the memory cell $M_1$ to the bit line $B_1$. If the ratio of the capacitance $C_{B1}$ of the bit line $B_1$ to the capacitance of the memory cell $M_1$ is, for example, 40, the potentials at the nodes $a$ and $c$ are 3.9 volts, which is 0.1 volts lower than the potentials at the nodes $b$ and $d$.

Next, when the clock signal $\phi_C$ becomes 0 volt at an instant II, the transistors $Q_4$ and $Q_5$ are turned off, so that the sensing circuit is disconnected from the bit lines $B_1$ and $B_2$ and the information from the memory cell $M_1$ is confined in the sensing circuit.

Then, when the clock signal $\phi_D$ becomes 12 volts in the time interval between instants III to IV, the transistor $Q_3$ is turned on to amplify the signal in accordance with the information at the nodes $a$ and $b$, by which the potentials at the nodes $a$ and $b$ are set at 0 and 4 volts, respectively. If the clock signal $\phi_D$ has a fast rise time, the potential at the node $b$ may become a little lower than its normal value.

Thereafter, when the clock signal $\phi_L$ becomes 12 volts in the time interval between the instants IV to V, the transistors $Q_6$ and $Q_7$ are turned on to set the bit lines $B_1$ and $B_2$ at a sufficiently high potential, for example, about 10 volts.

Next, after the instant V, when the clock signal $\phi_C$ becomes 12 volts again after the clock signal $\phi_L$ has been reduced to 0 volt to turn off the transistors $Q_6$ and $Q_7$, the transistors $Q_4$ and $Q_5$ are turned on and the potentials at the nodes $c$ and $d$ are dropped in accordance with the signal already amplified in the sensing circuit. That is, charges in the bit lines $B_1$ are discharged through the transistors $Q_4$, $Q_1$ and $Q_3$ to reduce the potential at the node $c$ to 0 volts. Conversely, charges in the bit line $B_2$ are redistributed in accordance with the capacitances of the node $b$ and the bit line $B_2$. For example, if the ratio of the capacitance of the node $b$ to that of the bit line $B_2$ is 1:10, the potential at the node $d$ becomes 9.5 volts. At this instant, the same state as that of the memory cell $M_1$ selected by the word line $W_1$ is established in the bit line $B_1$ and information is rewritten in the memory cell through the transistor $Q_{S1}$ remaining in its on state.

Next, when the potential of the word line $W_1$ is reduced to zero at an instant VI, the transistor $Q_{S1}$ is turned off, thus completing the series of operations.

The above description has been made on the assumption that the information "0" is stored in the memory cell. In the case of information "1" (for example, 8 volts) being stored, the basic operations are the same as those in the case of the information "0" except that the potentials appearing at the nodes $a$ and $c$ are 4.1 volts and that the nodes $a$, $c$ and $b$, $d$ are set at 9.5 and 0 volts, respectively, after the completion of the operations. In connection with the information "1" and "0" stored in the memory cell M, it must be noted that when the information is transmitted to the sensing circuit from the memory cell M, the directions of currents of the information "1" and "0" flowing through the transistors $Q_4$ and $Q_5$ are reverse to each other and that the transistors $Q_4$ and $Q_5$ are therefore required to have the property of transmitting the signals in both directions. Accordingly, the clock signal $\phi_C$ is required to have a high level which is more than about 1.5 times the threshold voltage of the transistors $Q_4$ and $Q_5$, as compared with the precharge level.

As will be understood from the foregoing, in the embodiment of FIG. 2, if it is arranged so that the clock signals $\phi_C$ and $\phi_L$ do not become 12 volts at the same time, the DC path between the power source and the ground, which presents a problem in the prior art circuit, is not formed, and consequently power consumption is remarkably reduced. During the detecting operation, the low impedance load transistors are disconnected from the load capacitances of the bit lines, so that, for example, in the case of the above embodiment, the sensitivity can be expected to be improved at least 3 times or more, as compared with the sensitivity of the conventional circuit. With the circuit construction shown in FIG. 2, the potential at the node $d$ drops a little in some cases, such as, 0.5 volts in the foregoing and shown as $\Delta V$ in FIG. 3, but this does not matter if the capacitances of the bit lines are sufficiently larger than the capacitance of the sensing circuit. Further, in the description of the foregoing embodiment of this invention, the voltages are given concrete values so as to facilitate a better understanding of the invention, but it should not be construed as limiting the invention specifically thereto.

Figure 4:
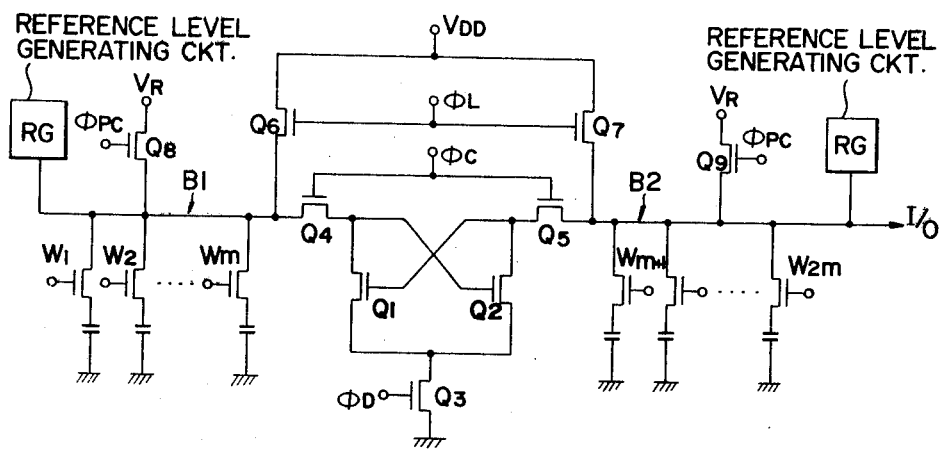
FIGS. 4 to 6 are circuit diagrams respectively showing the principal parts of other embodiments of this invention.

FIG. 4 illustrates another embodiment of this invention, in which the precharge circuits PC shown in FIG. 2 are formed with MIS transistors $Q_8$ and $Q_9$ and precharge the bit lines $B_1$ and $B_2$ by clock signals $100_{PC}$. When the transistors $Q_8$ and $Q_9$ are actuated in the triode region, a power source $V_R$ provides the precharge level. In this case, the transistors are not affected by dispersion, for example, in their threshold voltages, electrostatic capacitances, etc. which is introduced in the manufacture of the transistors. This is not requisite but advantageous in practical use. In FIG. 4, if the voltage level of the power source $V_R$ having connected thereto the drains of the transistors $Q_8$ and $Q_9$ is preset at the central value of the signal level of the memory cell, there are obtained the advantages that the reference level generating circuits RG can be dispensed with and that when the level of the power source $V_R$ is changed from the outside, the operation margin of the sensing circuit in an IC can be measured. However, where a noise from the word line selecting signal is produced other than the reference level, a dummy cell may be connected to the bit line opposite from that of the selected memory cell so that a noise equal to the abovesaid one may be applied to the bit line.

Figure 5:
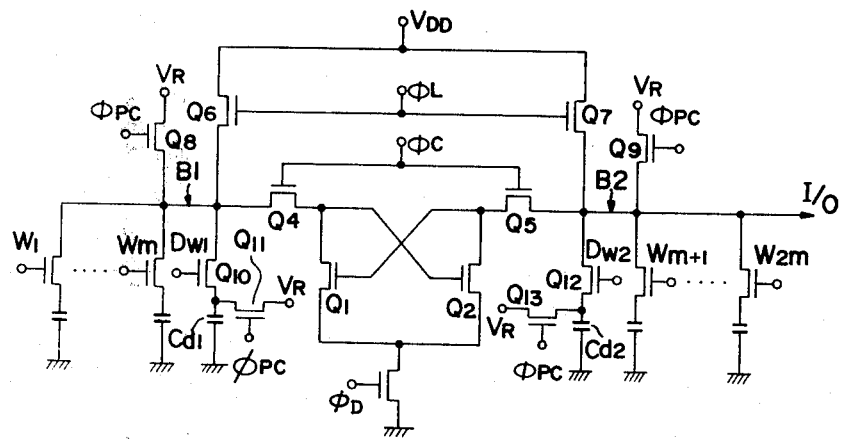

FIG. 5 shows another embodiment of this invention which employs dummy cells and is suitable for use as a circuit in which the power source voltage $V_R$ is the reference level. The dummy cells respectively comprise a combination of a transistor $Q_{10}$ and a capacitance $C_{d1}$ and a combination of a transistor $Q_{12}$ and a capacitance $C_{d2}$. Circuits for supplying signals to the dummy cells are formed with transistors $Q_{11}$ and $Q_{13}$, respectively. In the present embodiment, before the actuation of the sensing circuit, the clock signals $\phi_{PC}$ are applied to the gates of the transistors $Q_{11}$ and $Q_{13}$ to cause them to charge the capacitances $C_{d1}$ and $C_{d2}$ by the power source voltage $V_R$ to be equipotential to the bit lines $B_1$ and $B_2$. Then, when a desired word line is selected, an information signal is sent out from the memory cell connected to the selected word line to the associated bit line and, at the same time, a noise resulting from the capacitive coupling of the word line with the bit line is applied to the latter. To avoid this, the dummy cell on the opposite side from the selected word line with respect to the sensing circuit is selected, by which a noise in-phase with the abovesaid noise is applied to the bit line to provide for enhanced stability in the operation of the sensing circuit.

Figure 6:
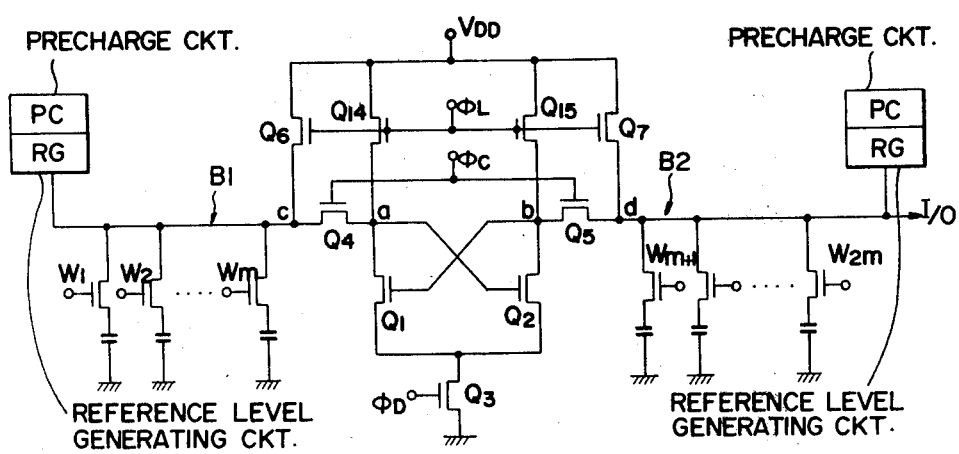

FIG. 6 is a circuit diagram showing the principal part of another embodiment of this invention. With this embodiment, it is possible to prevent the potential at the node of higher potential from lowering by $\Delta V$ which has been discussed previously in connection with the embodiment of FIG. 2.

The FIG. 6 embodiment is different, for example, from the FIG. 2 embodiment in that MIS transistors $Q_{14}$ and $Q_{15}$ of high impedance are respectively inserted between the power source and the node $a$ and between the power source and the node $b$ so that the clock signal $\phi_L$ can be applied to the gates of the transistors $Q_{14}$ and $Q_{15}$.

Figure 7:
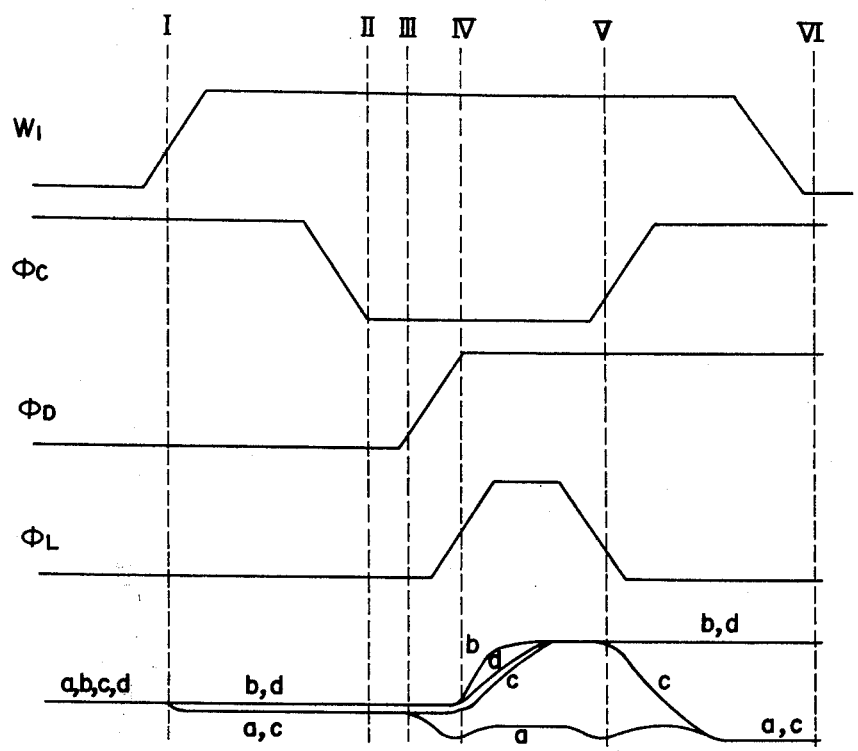
FIG. 7 is a timing chart explanatory of the operation of the circuit shown in FIG. 6.

FIG. 7 is a time chart which is explanatory of the operation of the FIG. 6 embodiment and is identical with FIG. 3 except that the level variations at the nodes $a$, $b$, $c$ and $d$ are different from those in the latter.

In the embodiment of FIG. 2, when the clock signal $\phi_C$ is at a low level, that is, when the transistors $Q_4$ and $Q_5$ are in their off state, the bit lines $B_1$ and $B_2$ are charged up. In the embodiment of FIG. 6, however, since the transistors $Q_{14}$ and $Q_{15}$ are also turned on simultaneously with the charging up of the bit lines $B_1$ and $B_2$, signal amplification takes place again in the sensing circuit and the voltage at the node of the higher potential in the sensing circuit is charged up to a level substantially equal to the charge up level of the bit lines. Accordingly, when the clock signal $\phi_C$ is raised to a high level again, it is possible to prevent the lowering of the level at the node of the higher potential which is caused by redistribution of charges. This enables rewrite at a sufficiently high potential level.

The present inventors have produced semiconductor memories having the circuits of FIGS. 2 and 6 by way of trial but, prior to the trial production, they conducted simulation, by an electronic computer, of a conventional circuit employed in 4K bit MOS.RAM and the circuits of FIGS. 2 and 6. The results of the simulation are as follows:

Table 1

|  | Power consumed | Detection sensitivity |
| --- | --- | --- |
| Conventional circuit | 6 to 7 [mW] | 200 to 300 [mV] |
| FIG. 2 circuit | 0.13 [mW] | below 50 [mV] |
| FIG. 6 circuit | 0.21 [mW] | below 50 [mV] |

The above table indicates that if designed by substantially the same design criteria, the circuits of this invention provide improvements of 30 times in power consumption and four times in detection sensitivity as compared with the conventional circuit. These results were well in agreement with the experimental results of the circuits produced by way of trial.

As has been described in the foregoing, in accordance with this invention, the signal detecting circuit formed with a flip-flop circuit and the bit lines, each having connected thereto a plurality of memory cells, are interconnected by the separation transistors, and the power supply transistors are inserted at least between the power sources and the bit lines and, in the signal detection, the abovesaid separation transistors are turned off, by which the power consumption is held small and a high-speed and highly sensitive detecting operation can be achieved regardless of an increase in the number of memory cells. Accordingly, if the circuit of this invention is applied to a large capacity IC memory, it is possible to obtain a high-density and economical IC memory having miniaturized memory cells by taking advantage of the low power consumption characteristic and high sensitivity characteristic of the circuit of this invention.

This invention is not limited specifically to the foregoing embodiments but may be variously modified within the scope of the appended claims. For example, in the case of a sensing amplifier being formed on an IC, since the MIS transistor $Q_3$ in FIGS. 2 and 4 to 6 need not be connected to each flip-flop circuit, it is also possible to adopt such a circuit construction that a plurality of flip-flop circuits, each comprising the transistors $Q_1$ and $Q_2$, are grounded through the single transistor $Q_3$. In this manner, many modifications and variations may be effected without departing from the scope of the novel concepts of this invention.

What is claimed is:

1. A weak signal detecting circuit comprising:
   a flip-flop circuit composed of first and second MIS transistors having sources connected together and having the drain and gate of one MIS transistor respectively inter-connected to the gate and drain of the other MIS transistor;
   a third MIS transistor connected between the drain of the first MIS transistor and a first bit line so that the drain and source of the third MIS transistor provide a current path therethrough;
   a fourth MIS transistor connected between the drain of the second MIS transistor and a second bit line so that the drain and source of the fourth MIS transistor provide a current path therethrough the gates of the third and fourth MIS transistors being so connected as to be supplied with a first clock signal;
   a fifth MIS transistor having a source connected to the first bit line;
   a sixth MIS transistor having a source connected to the second bit line, the drains of the fifth and sixth MIS transistors being connected together and to a first power source, and their respective gates being so connected as to be supplied with a second clock signal;
   a reference level generating circuit connected to the first and second bit lines;
   a precharge circuit connected to the first and second bit lines;
   a seventh MIS transistor having a drain connected to the sources of the first and second MIS transistors, the source of the seventh MIS transistor being grounded and the gate being so connected as to be supplied with a third clock signal;
   wherein the third and fourth MIS transistors are turned off only during signal detection while being operative throughout the rest of the operation, two additional MIS transistors having their sources respectively connected to the drains of the first and second MIS transistors, their drains connected together and to the first power source, and their gates so connected together as to be supplied with a second clock signal, wherein the fifth, sixth and two additional MIS transistors are turned on only during the time that the third and fourth MIS transistors are turned off, and
   wherein the input/output is taken from one of said bit lines.

2. The weak signal detecting circuit according to claim 1, wherein one of the precharge circuits comprises an eighth MIS transistor having its source connected to the first bit line, and the other precharge circuit comprises a ninth MIS transistor having its source connected to the second bit line, the eighth and ninth MIS transistors having their drains connected together and to a second power source, and their gates so connected together as to be supplied with a fourth clock signal.

3. The weak signal detecting circuit according to claim 2, wherein the voltage of the second power source is set at a level substantially equal to a reference voltage level of the circuit to provide the function of the reference level generating circuit.

4. The weak signal detecting circuit according to claim 3, further comprising a dummy cell connected to each of the first and second bit lines, said dummy cells being set by the fourth clock signal at a level equal to a precharge level of the bit line.

5. The weak signal detecting circuit according to claim 1, wherein the reference level generating circuits each comprise a dummy cell.

6. The weak signal detecting circuit according to claim 1, wherein an input/output circuit is connected to at least one of said first and second bit lines, said input/output circuit being capable of removing a detected signal and writing in information.

* * * * *